United States Patent
Sun et al.

(10) Patent No.: US 9,033,515 B2
(45) Date of Patent: May 19, 2015

(54) HEAT DISSIPATION DEVICE OF LIGHT ENGINE WITH FAN MODULE AND HEAT SINK

(75) Inventors: Ming-Chih Sun, New Taipei (TW); Kai Huang, New Taipei (TW)

(73) Assignee: HON HAI PRECISION INDUSTRY CO., LTD., New Taipei ( * ) Notice: Subject to any disclaimer, the term of this patent is extended or adjusted under 35 U.S.C. 154(b) by 406 days.

(21) Appl. No.: 13/469,150

(22) Filed: May 11, 2012

(65) Prior Publication Data

US 2013/0120716 A1    May 16, 2013

(30) Foreign Application Priority Data

Nov. 11, 2011   (TW) .............................. 100141249 A

(51) Int. Cl.
| | |
|---|---|
| G03B 21/16 | (2006.01) |
| G03B 21/18 | (2006.01) |
| G03B 21/28 | (2006.01) |
| G03B 21/26 | (2006.01) |
| H04N 9/31 | (2006.01) |
| H01S 3/04 | (2006.01) |
| H01L 23/34 | (2006.01) |

(52) U.S. Cl.
CPC ................ *G03B 21/16* (2013.01); *G03B 21/18* (2013.01); *G03B 21/28* (2013.01); *G03B 21/26* (2013.01); *H04N 9/31* (2013.01); *H01S 3/04* (2013.01); *H01L 23/34* (2013.01)

(58) Field of Classification Search
CPC ........ G03B 21/16; G03B 21/18; G03B 21/28; G03B 21/26; H04N 9/31; H01S 3/04; H01L 23/34
USPC .................. 353/61, 81, 57, 60, 119; 348/771; 372/36; 257/706, 717, 796
See application file for complete search history.

(56) References Cited

U.S. PATENT DOCUMENTS

| | | | | |
|---|---|---|---|---|
| 2009/0290131 | A1* | 11/2009 | Kim et al. ........................ | 353/61 |
| 2010/0033690 | A1* | 2/2010 | Chen et al. ....................... | 353/61 |
| 2010/0045941 | A1 | 2/2010 | Chen | |
| 2010/0066982 | A1* | 3/2010 | Hsieh et al. ..................... | 353/61 |
| 2011/0019161 | A1 | 1/2011 | Chen | |

FOREIGN PATENT DOCUMENTS

| | | |
|---|---|---|
| CN | 101655656 A | 2/2010 |
| CN | 101986195 A | 3/2011 |

* cited by examiner

*Primary Examiner* — Toan Ton
*Assistant Examiner* — Magda Cruz
(74) *Attorney, Agent, or Firm* — Novak Druce Connolly Bove + Quigg LLP

(57) ABSTRACT

A heat dissipation device of a light engine for a projector has a housing, a fan module, a light engine and a heat sink. The light engine is positioned in the housing and connected to the heat sink. The heat sink is positioned out of the housing. The housing has a fan-enclosed flow channel attached on an outer surface of the housing. The fan module is guided by the fan-enclosed flow channel to the heat sink to enhance heat dissipation efficiency of the light engine for the projector.

7 Claims, 4 Drawing Sheets

HEAT DISSIPATION DEVICE OF LIGHT ENGINE WITH FAN MODULE AND HEAT SINK

BACKGROUND

1. Technical Field

The disclosure is related to a heat dissipation device of a light engine for projectors, and particularly, to a heat dissipation device having a fan-enclosed flow channel capable of increasing heat dissipation efficiency.

2. Description of Related Art

Light sources for projectors, for example tungsten-halogen lamps, metal-halogen lamps, high-pressure mercury-vapor lamps, xenon lamps, light-emitting diodes, or laser diodes, generates heat during operation. The high brightness and illumination intensity of the light sources, therefore, are accompanied with intensive heat. Such heat propagates into and thus heats the downstream optical devices. The heated optical devices may reach temperatures beyond their respective tolerances, resulting in performance distortion, and even device failure. Known attempts to overcome the problems associated with the generation of excessive heat involve the creation of diverse heat dissipating structures. The heat dissipation devices of the current projector are several fans installed inside the housing of the projectors and pipes configured for the fans. However, the assembly of the fans and pipes requires more working hours that increases manufacturing cost. Therefore, there is room for improvement in the art.

BRIEF DESCRIPTION OF THE DRAWINGS

The components in the drawings are not necessarily drawn to scale, the emphasis instead being placed upon clearly illustrating the principles of a heat dissipation device of a projector. Moreover, in the drawings, like reference numerals designate corresponding parts throughout the several views.

DETAILED DESCRIPTION

The disclosure will be described with references to the accompanying diagrams.

Figure 1:
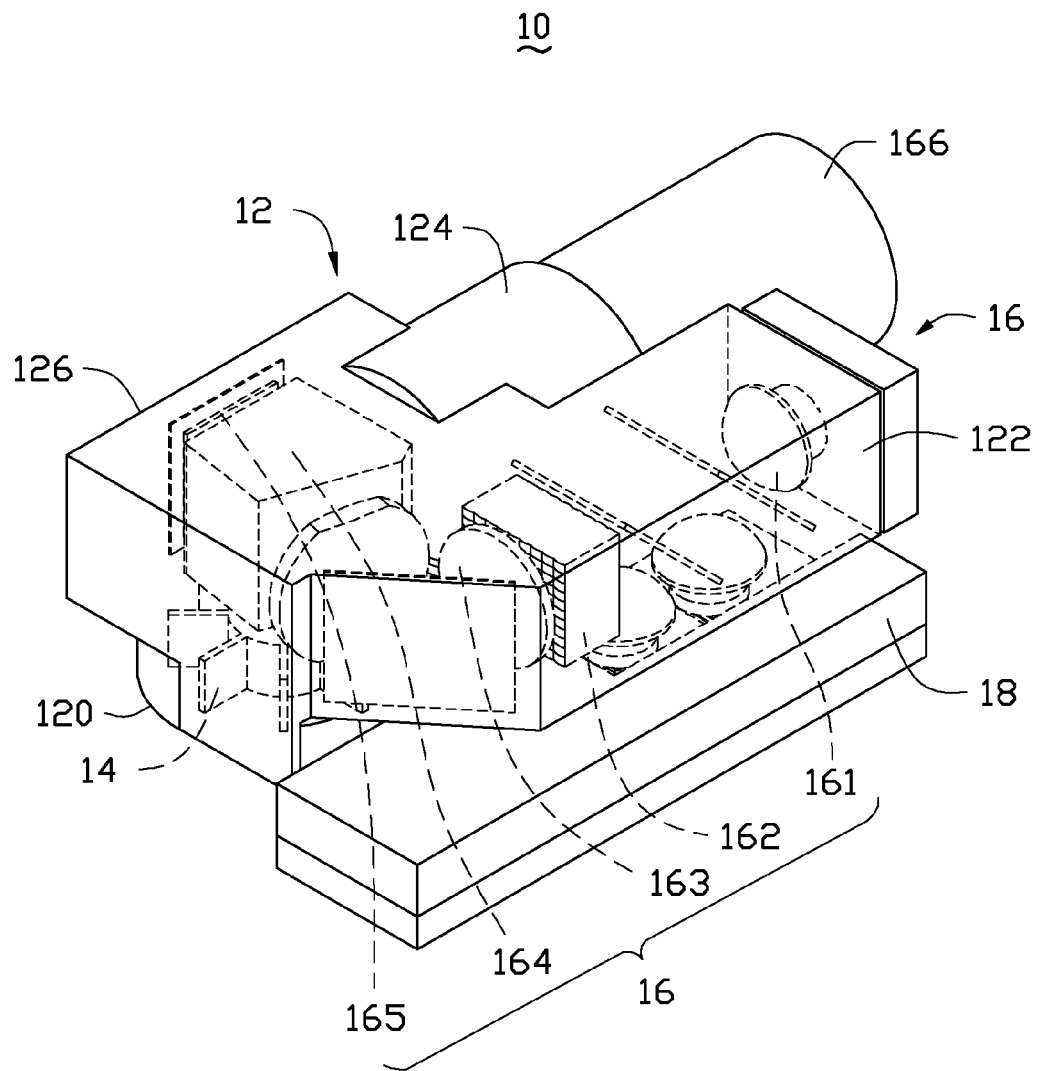
FIG. 1 shows a schematic diagram of a heat dissipation device of a light engine for a projector of the disclosure.

FIG. 1 shows a heat dissipation device 10 of a projector of the disclosure. The heat dissipation device 10 includes a housing 12, a fan module 14, a light engine 16, and a heat sink 18. The housing 12 has a first chamber 122, a second chamber 124 and a tunnel 126 connected between the first chamber 122 and the second chamber 124. In the present embodiment, the first chamber 122 and the second chamber 124 are arranged in parallel. The tunnel 126 is connected at a flange of the first chamber 122. The housing 12 uses metal having good heat conductivity as its material. The light engine 16 has a light source 161, a light mixing device 162, a light guide 163, a prism set 164, a digital micromirror device 165, and a lens module 166. The light source 161 is placed in the first chamber 122. The lens module 166 is placed in the second chamber 124. The light mixing device 162, the light guide 163, the prism set 164, and the digital micromirror device 165 are placed in the tunnel 126. Accordingly, the main components of the optical engine device 16 are located within the housing 12. The light source 161 of the light engine 16 generates the majority of the heat. Therefore, the heat sink 18 is attached to the light engine 16 where the light source 161 placed. The heat sink 18 is engaged with the light source 161 from the outside of the housing 12; for instance, the heat sink 18 is attached to an outer surface of the first chamber 122 of the housing 12. In addition to the light source 161, other electronic devices which generate heat during operation may be connected on the heat dissipation device 18. The heat sink 18 is made of high-thermal conductive material. The heat sink 18 may further includes fin structures for increasing heat dissipation area (not shown).

The light source 161 generates a RGB color module referring to three primary colors, including red lights, green lights, and blue lights. Red lights, green lights and blue lights from the RGB color module are added together as a light beam by the light mixing device 162. The light beam is projected to the light guide 163, which acts as a diffuser to scatter lights and to guide the light beam to the prism set 164 and the digital micromirror device 165. The prism set 164 has at least two prisms for reverse total internal reflection. The light beam is reflected by the prism set 164 to the digital micromirror device 165. The digital micromirror device 165 accepts the light beam and reflects it as an image light beam. Then, the image light beam is reverse reflected by the prism set 164 to the lens module 166 for projecting an image.

Figure 2:
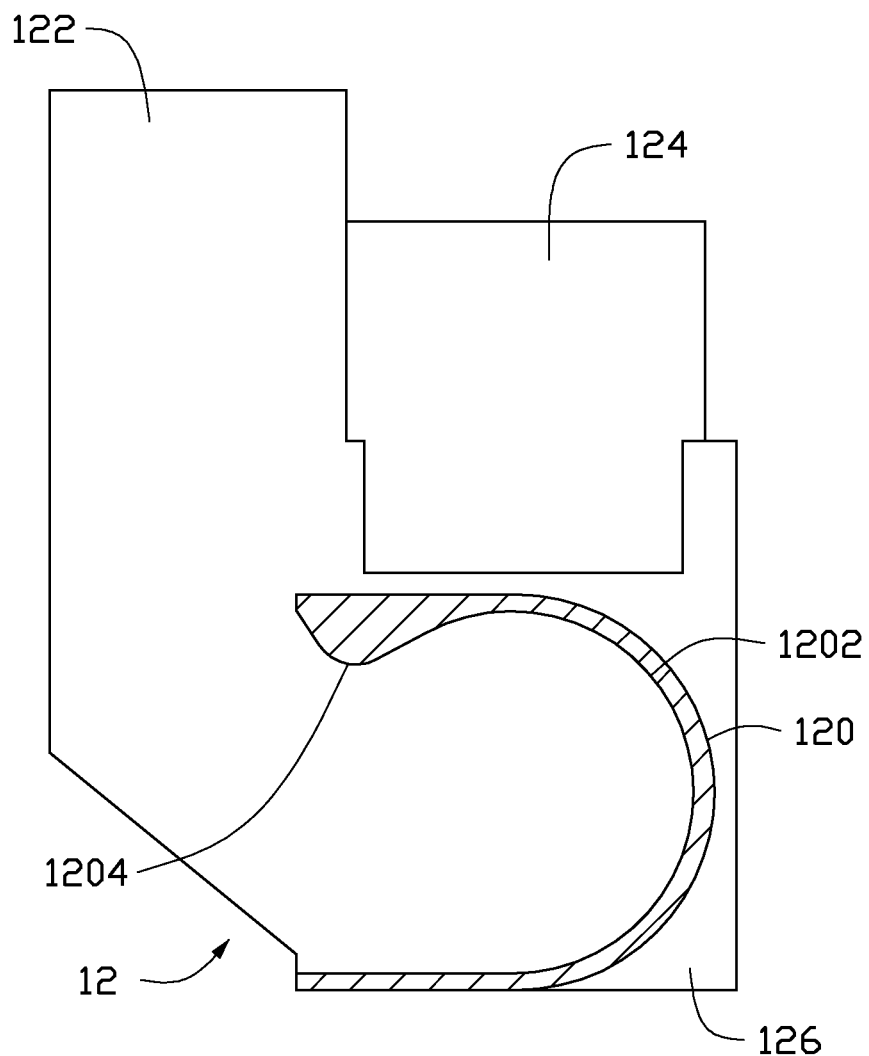
FIG. 2 is a schematic diagram illustrating a fan-enclosed flow channel of a housing.
Figure 3:
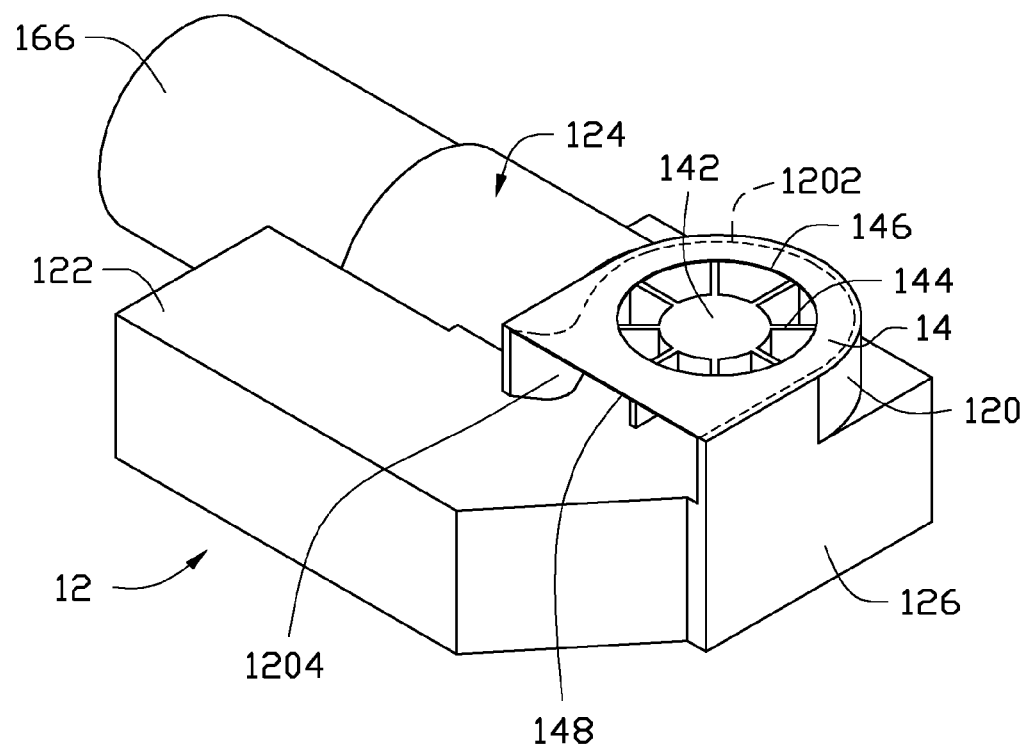
FIG. 3 is a schematic diagram illustrating a fan module assembled in the fan-enclosed flow channel of the disclosure.

Light path of the optical engine device 16 starts at the light source 161 and transmits in the housing 12 before it projects from the lens module 166. The housing 12 further includes a fan-enclosed flow channel 120 attached to an outer surface of the tunnel 126 of the housing 12 (see FIG. 2). The fan-enclosed flow channel 120 is a C-shaped air diversion panel and has an entrance 1202 and an exit 1204 beside the entrance 1202. The entrance 1202 of the fan-enclosed flow channel 120 is used for assembling the fan module 14. The fan module 14 is directly placed in the fan-enclosed flow channel 120 (see FIG. 3). The fan module 14 is a centrifugal fan which includes a drive shaft 142 and a plurality of impellers 144 attached to the circumference of the drive shaft 142. The drive shaft 142 and the impellers 144 are assembled in the fan-enclosed flow channel 120 via the entrance 1202. The axis of the drive shaft 142 is an inlet duct 146 of the fan module 14 which is corresponding to the entrance 1202 of the fan-enclosed flow channel 120. The fan module 14 has an outlet duct 148, which is substantially perpendicular to the axis of the drive shaft 142, facing the exit 1204 of the fan-enclosed flow channel 120.

Figure 4:
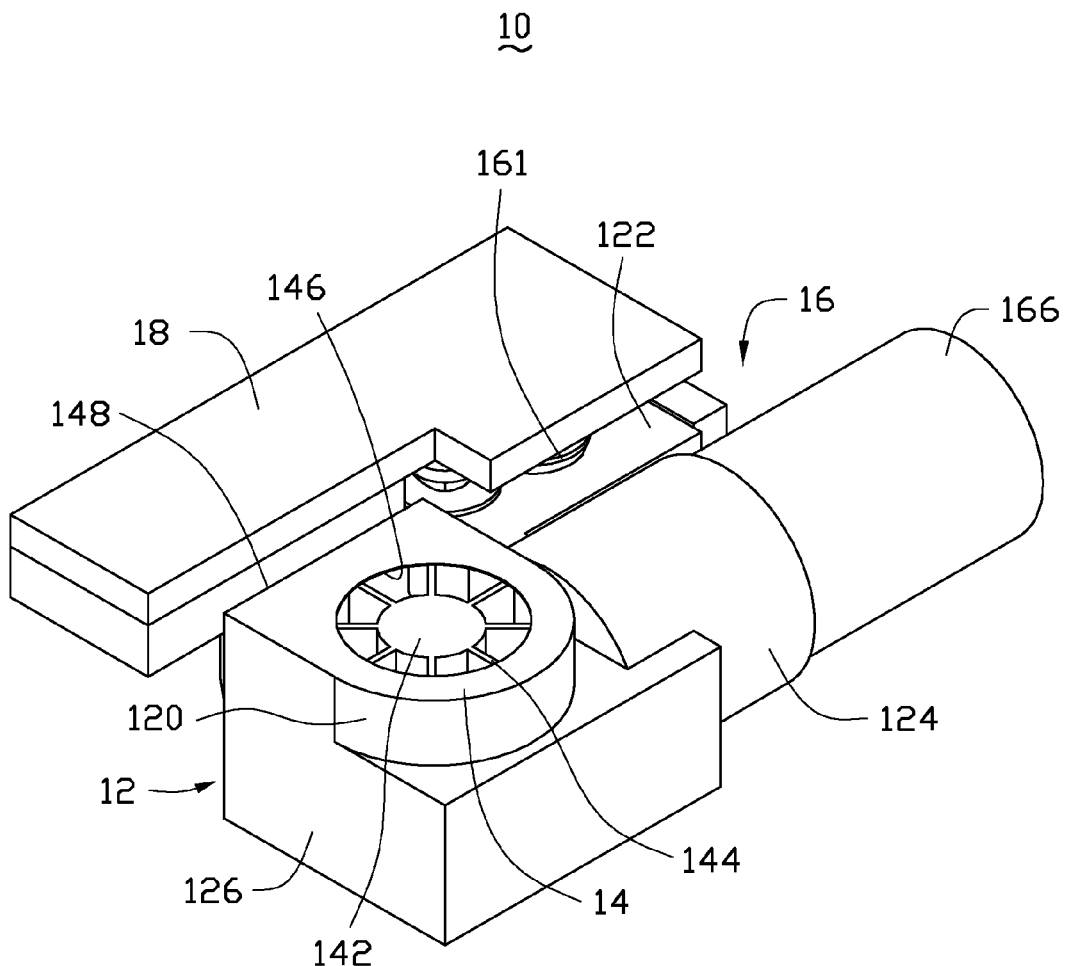
FIG. 4 is another schematic diagram of the heat dissipation device of the light engine.

When the drive shaft 142 is turned on, ambient air enters from the inlet duct 146, turns 90 degrees, and exits the fan module 14 through the outlet duct 148 to form air flow. Air flow is guided by the fan-enclosed flow channel 120 to pass through the housing 12 and leaves the fan module 14 from the outlet duct 148. Subsequently, air flow with heat flows to the heat sink 18 (see FIG. 4). In addition to the heat sink 18, heat generated by the light engine 16 is simultaneously conducted through the housing 12 to increase heat dissipation efficiency of the optical engine 16.

The fan-enclosed flow channel 120 of the disclosure is integrated into the housing 12 on its outer surface. The fan module 14 is directly assembled within the fan-enclosed flow channel 120. The air flow induced by the fan module 14 effectively cools down the optical engine 16. Therefore, the heat dissipation device 10 of the disclosure has advantages of simple design, ease of assembly, low cost, and good performance.

Although the present disclosure has been specifically described on the basis of this exemplary embodiment, the disclosure is not to be construed as being limited thereto. Various changes or modifications may be made to the embodiment without departing from the scope and spirit of the disclosure.

What is claimed is:

1. A heat dissipation device of a light engine for a projector, comprising
   a fan module;
   a housing comprising a first chamber, a second chamber, a tunnel connected between the first chamber and the second chamber, and a fan-enclosed flow channel on an outer surface of the housing to enclose the fan module;
   a light engine located in the housing and comprising a light source, a light mixing device, a light guide, a prism set, a digital micromirror device, and a lens module, the light source positioned in the first chamber, the lens module positioned in the second chamber, and the light mixing device, the light guide, the prism set, and the digital micromirror device positioned in the tunnel; and
   a heat sink connected to the light engine via the housing;
   wherein the fan-enclosed flow channel guides air flow induced by the fan module to the heat sink.

2. The heat dissipation device of claim 1, wherein the first chamber and the second chamber are arranged in parallel, and the tunnel connects the first chamber at a flank of the first chamber facing the second chamber.

3. The heat dissipation device of claim 1, wherein the fan-enclosed flow channel has an entrance for placing the fan module and an exit positioned beside the entrance.

4. The heat dissipation device of claim 3, wherein the fan module comprises a drive shaft and a plurality of impellers connected to the circumference of the drive shaft.

5. The heat dissipation device of claim 4, wherein the entrance is parallel to the axis of the drive shaft, and the exit is substantially perpendicular to the axis of the drive shaft and faces the heat sink.

6. The heat dissipation device of claim 1, wherein the fan-enclosed flow channel comprises a C-shaped air diversion panel.

7. The heat dissipation device of claim 1, wherein the heat sink is connected to the light source of the light engine.

* * * * *